United States Patent
Wei et al.

(10) Patent No.: US 8,913,702 B2
(45) Date of Patent: Dec. 16, 2014

(54) LNB FREQUENCY DOWN CONVERSION INTEGRATED CIRCUIT AND CHIP, LNB FREQUENCY DOWN CONVERSION CIRCUIT AND METHOD

(75) Inventors: Shunran Wei, Shanghai (CN); Xunsong Yin, Shanghai (CN)

(73) Assignee: RDA Technologies Limited, Hong Kong (CN)

( * ) Notice: Subject to any disclaimer, the term of this patent is extended or adjusted under 35 U.S.C. 154(b) by 70 days.

(21) Appl. No.: 13/809,464

(22) PCT Filed: May 10, 2011

(86) PCT No.: PCT/CN2011/073870
§ 371 (c)(1),
(2), (4) Date: Apr. 23, 2013

(87) PCT Pub. No.: WO2012/006899
PCT Pub. Date: Jan. 19, 2012

(65) Prior Publication Data
US 2013/0202071 A1 Aug. 8, 2013

(30) Foreign Application Priority Data

Jul. 14, 2010 (CN) .......................... 2010 1 0226495
Feb. 24, 2011 (CN) .......................... 2011 1 0044008

(51) Int. Cl.
| H04B 1/10 | (2006.01) |
| H04N 7/20 | (2006.01) |
| H04L 1/00 | (2006.01) |
| H03D 7/16 | (2006.01) |
| H04H 40/90 | (2008.01) |
| H03D 7/18 | (2006.01) |

(52) U.S. Cl.
CPC ................ *H04L 1/0036* (2013.01); *H04N 7/20* (2013.01); *H03D 7/165* (2013.01); *H04H 40/90* (2013.01); *H03D 7/18* (2013.01)

USPC .......... 375/350; 375/316; 455/296; 455/302; 455/311

(58) Field of Classification Search
CPC ........ H04L 1/0036; H04N 7/20; H04H 40/90; H03D 7/165; H03D 7/18
USPC ................. 375/316, 324, 340, 350; 455/63.1, 455/67.13, 114.2, 130, 296, 326, 311, 316, 455/318, 333, 334, 302; 370/335, 342; 327/551
See application file for complete search history.

(56) References Cited

U.S. PATENT DOCUMENTS

| 7,088,981 B2 * | 8/2006 | Chang ........................... 455/326 |
| 7,139,547 B2 * | 11/2006 | Wakayama et al. ........... 455/333 |
| 2006/0088122 A1 | 4/2006 | Choi et al. |

FOREIGN PATENT DOCUMENTS

| CN | 101331679 A | 12/2008 |
| CN | 101465630 A | 6/2009 |

OTHER PUBLICATIONS

International Search Report issued in PCT Application No. PCT/CN2011/073870 dated Jul. 7, 2011.

*Primary Examiner* — Leon Flores
(74) *Attorney, Agent, or Firm* — MKG, LLC (57) ABSTRACT

The present invention discloses a type of LNB frequency down conversion integrated circuit. The present invention frequency-down-converts the RF signal with the Quadrature local oscillation signal (LO) and Quadrature Mixer. Then the 90 degree phase-shifting of the quadrature intermediate frequency (IF) signal after mixed is done by the use of passive Polyphase filter. The present invention further discloses a LNB frequency down conversion chip, a LNB frequency down circuit adopting the LNB frequency down conversion chip circuit and a method of LBN frequency down. The invention ensures the elimination of the minor image signal and the realization of the minor image suppression function.

25 Claims, 5 Drawing Sheets

LNB FREQUENCY DOWN CONVERSION INTEGRATED CIRCUIT AND CHIP, LNB FREQUENCY DOWN CONVERSION CIRCUIT AND METHOD

FIELD OF THE INVENTION

The present invention is related to a type of circuit of signal processing chip, especially a type of circuit of LNB frequency down conversion chip. The present invention is further related to a type of LNB frequency down conversion chip. The present invention is also related to a type of signal processing circuit, especially a type of LNB frequency down conversion circuit. The present invention is also related to a method of LNB frequency down conversion.

BACKGROUND

LNB, i.e. Low Noise Block, generally called high frequency head, is a device installed at the reflection focal point of satellite receiving antenna to amplify the satellite signal and down convert the frequency of it.

Figure 1:
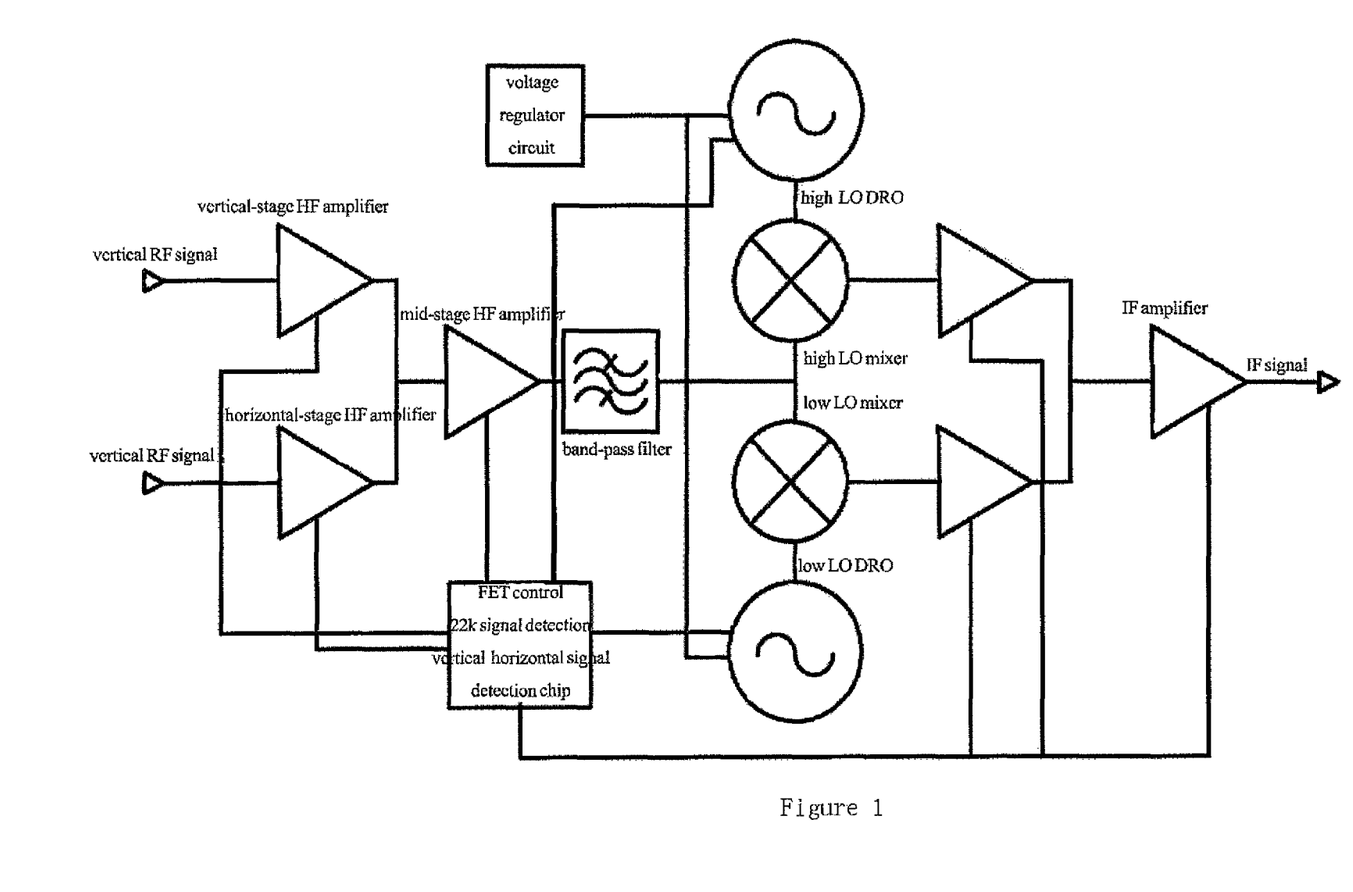
FIGS. 1 and 2 are the structure diagrams of the existing LNB frequency down conversion circuit.
Figure 2:
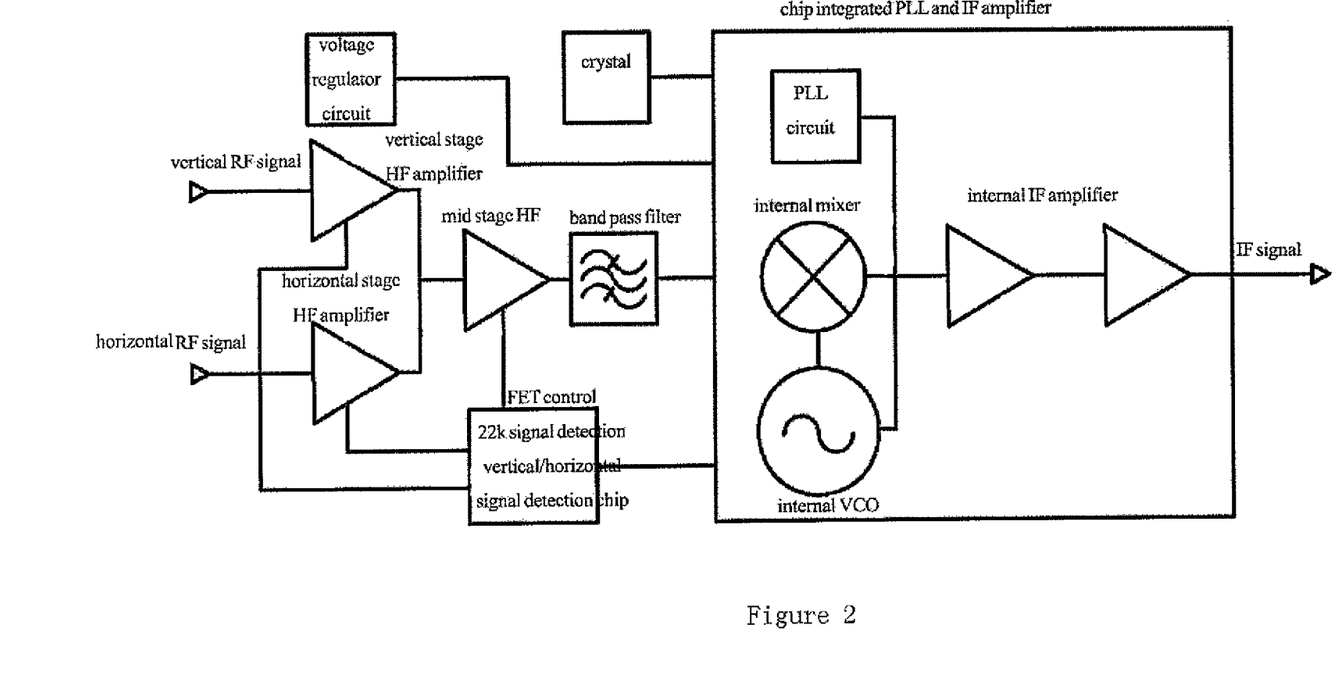

LNB now is generally designed using discrete components, including high frequency (HF) amplifier, passive band-pass filter, Dielectric Resonator Oscillator (DRO), frequency mixer, mid-frequency (MF) amplifier, voltage stabilizing unit, bias circuit, negative voltage generating circuit, 22 kHz frequency detection circuit, etc., as shown in FIGS. 1 and 2.

The shortcomings of the traditional scheme are as follows:

1. Dielectric Resonator Oscillator (DRO) has characteristic of larger temperature drift, therefore, the frequency stability of LNB is not sufficient.

2. The signal out of band, especially the signal of minor image portion, needs to be filtered with the passive band-pass filter to improve the noise performance of LNB. Band pass filter is featured with attenuation and occupies the valuable printed circuit board (PCB) area.

3. As the size of LNB is generally small, large quantity of discrete components are not convenient for repairing manufacturing and debugging.

SUMMARY

The technology problem to be solved in the present invention is to provide an LNB frequency down conversion chip circuits, a chip which adopts the LNB frequency down conversion circuit, an LNB frequency down conversion circuit which adopts the circuit of LNB frequency down conversion chip and a method of the LNB frequency down conversion, which adopts the circuit of LNB frequency down conversion chip. This invention can produce higher minor image suppression function, save the valuable PCB area occupied by band-pass filter and meanwhile ensure the excellent noise performance of LNB.

To solve the technology problems mentioned above, the technical solution of the LNB frequency down conversion integrated circuit of the present invention includes:

A pre-amplifier, to receive the output of the mid-stage high frequency (HF) amplifier of the front-end circuit and improve the noise coefficient of the chip to avoid worsening the noise of the whole LNB system; meanwhile, to transform the single-ended signal sent from the mid-stage HF amplifier to two differential signals to improve the suppression performance of common mode noise of the chip; wherein the said two differential signals are a first differential signal with the phase of 0 degree and a second differential signal with the phase of 180 degree, respectively;

A quadrature voltage-controlled oscillator, to output four local oscillation (LO) signals with a phase difference of 90 degree between each other, the four LO signals are a first LO signal with a phase of 90 degree, a second LO signal with a phase of 0 degree, a third LO signal with a phase of 270 degree and a fourth LO signal with a phase of 180 degree;

A quadrature frequency mixer, to receive the four LO signals sent from the said Quadrature voltage-controlled oscillator and the two differential signals sent from the pre-amplifier, wherein the said quadrature mixer mixes the first LO signal with the first differential signal to produce a first intermediate frequency (IF) signal with a phase of 90 degree, mixes the second LO signal with the first differential signal to produce a second IF signal with a phase of 0 degree, mixes the third LO signal with the second differential signal to produce a third IF signal with a phase of 270 degree, and mixes the fourth LO signal with the second differential signal to produce a fourth IF signal with a phase of 180 degree;

An In-phase/Quadrature (IQ) intermediate frequency amplifier, to receive the four IF signals output from the said quadrature mixer, to improve the driving capability of the quadrature mixer and to prevent the signals from attenuation;

A polyphase filter, to receive the output of the said on-chip IQ intermediate frequency amplifier, and to filter the four IF signals, which eliminates minor image signal and realizes the mirror image suppression function of the chip; and then to add the first IF signal with the second IF signal, to add the third IF signal with the fourth IF signal, which are of the four IF signals, with generating two signal outputs.

The present invention also discloses a type of LNB frequency down conversion circuit, the technology solution of which includes the circuit of the LNB frequency down conversion chip mentioned above and the external circuit of the circuit of the LNB frequency down conversion chip, wherein the said external circuit includes:

A vertical-stage high frequency (HF) amplifier, to receive a vertical signal of the radio frequency and amplify the electromagnetic wave in the vertical direction of satellite transmission signal which is received by satellite receiving antenna, wherein the said vertical-stage HF amplifier is featured with band pass within the received frequency band;

A horizontal-stage high frequency (HF) amplifier, to receive a horizontal signal of the radio frequency and amplify the electromagnetic wave in the horizontal direction of satellite transmission signal which is received by satellite receiving antenna, and wherein the said horizontal-stage HF amplifier is featured with band pass within the received frequency band;

A mid-stage high frequency (HF) amplifier, to receive output signals from the said vertical-stage HF amplifier and horizontal-stage HF amplifier, wherein the said mid-stage HF amplifier is in the constant operating state to further amplify the signals sent from the first stage HF amplifier, which also increases the whole gain of the amplifier in front of the frequency mixer and decreases the noise performance of the whole LNB system.

The present invention also discloses an LNB frequency down conversion chip, the technology solution of which is: the LNB frequency down conversion chip integrates the LNB frequency down conversion circuit mentioned above, and wherein the said LNB frequency down conversion chip circuit connects the external circuit of the said LNB frequency down conversion chip circuit by the pins of the LNB frequency down conversion chip.

The present invention also discloses an LNB frequency down conversion method by adopting the LNB frequency down conversion circuit mentioned above, the technology solution of which is, a received signal is pre-amplified by a pre-amplifier, to improve the noise performance of a chip, and to prevent the noise of the whole LNB system from being worsened, meanwhile a received single-ended signal is transformed into two differential signals, to improve the suppression performance of common mode noise, wherein the said two differential signals are a first differential signal with the phase of 0 degree and a second differential signal with the phase of 180 degree, respectively; a quadrature voltage-controlled oscillator outputs four local oscillation (LO) signals of with a phase difference of 90° between each other, which are a first LO signal with a phase of 90 degree, a second LO signal with a phase of 0 degree, a third LO signal with a phase of 270 degree and a fourth LO signal with a phase of 180 degree, respectively; a quadrature mixer mixes the first LO signal with the first differential signal to produce a first IF signal with the phase of 90 degree, mixes the second LO signal with the first differential signal to produce a second IF signal with a phase of 0 degree, mixes the third LO signal with the second differential signal to produce a third IF signal with a phase of 270 degree and mixes the fourth LO signal with the second differential signal to produce a fourth IF signal with a phase of 180 degree, and then an In-phase/Quadrature (IQ) intermediate frequency amplifier receives the four IF signals sent from the said quadrature frequency mixer, improves the driving capability of the quadrature mixer, and prevents the signals from attenuation; and then a polyphase filter receives the output of the on-chip IQ intermediate frequency amplifier, filters the four IF signals, eliminates minor image signal and realizes the mirror image suppression function of the chip; and then adds the first IF signal with the second IF signal, adds the third IF signal with the fourth IF signal, which are of the four IF signals, thus generating two signal outputs; and at last receives the outputs of the polyphase filter by an intermediate frequency (IF) amplifier, drives the off-chip 75 ohm cable line, ensures the output matching and outputs the IF signal.

The present invention simplifies the application, production and repairing of LNB and saves the cost, as it integrates most of the discrete elements of the existing discrete LNB design. The frequency stability performance of LNB is improved significantly by an integrated phase-locked loop circuit. The band-pass filter on the PCB is saved by integrating mirror image suppression function so that the cost of the PCB is saved and the noise performance is improved. The defective rate will be decreased during production and the effectiveness of production will be improved because the invention. It overcomes the shortcoming of low yield rate of the existing technology in production, improves the finished product rate in production process, and improves the efficiency of production.

BRIEF DESCRIPTION OF THE DRAWINGS

The following figures and examples will help explaining the present invention in detail.

DETAILED DESCRIPTION

Figure 3:
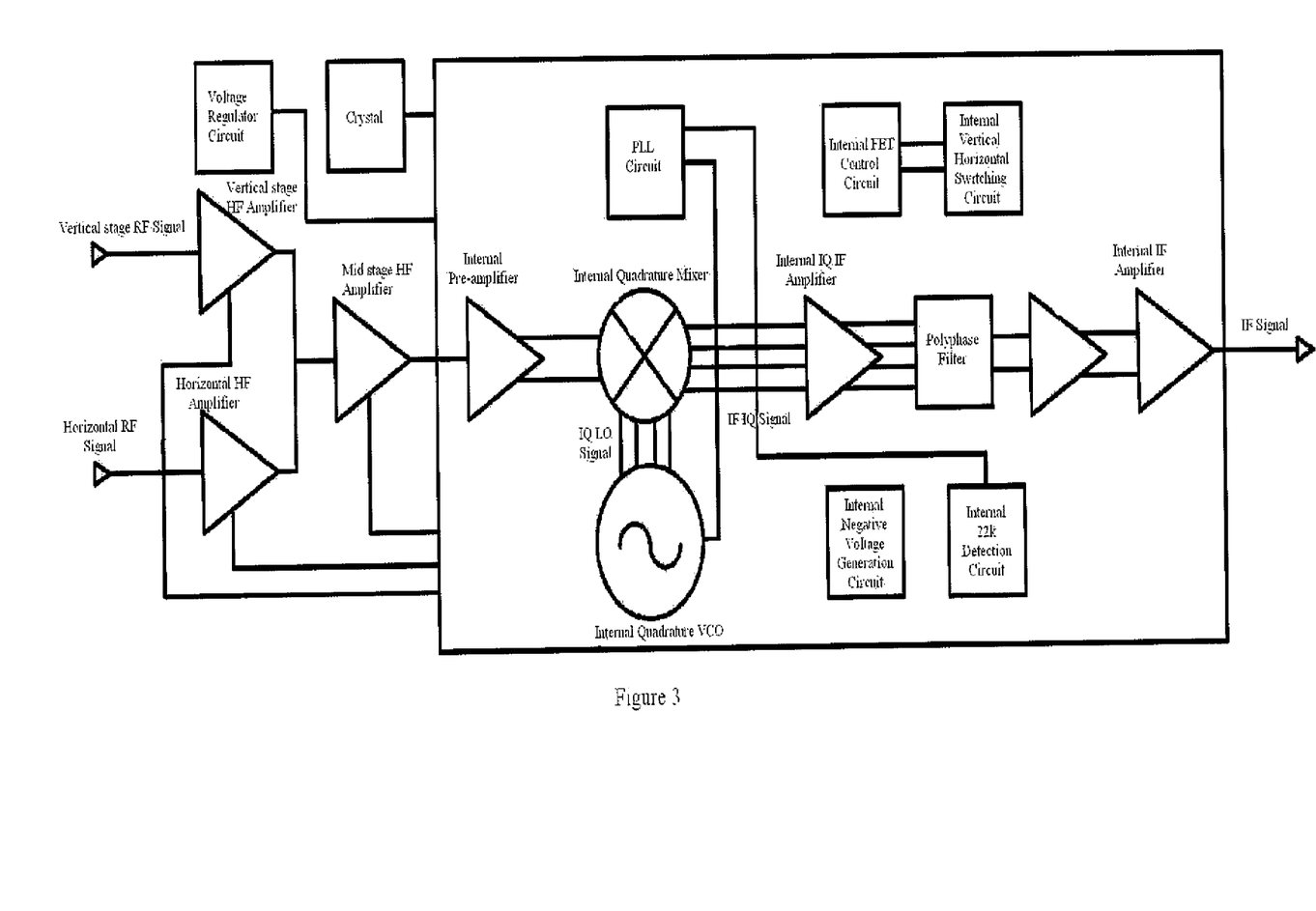
FIG. 3 is the structure diagram of the LNB frequency down conversion circuit of the present invention.

The present invention discloses a type of LNB frequency down conversion integrated circuit, as is shown in FIG. 3, including:

A pre-amplifier, to receive output of the mid-stage high frequency (HF) amplifier of the front-end circuit and improve the noise performance of the chip to avoid worsening the noise of the whole LNB system; meanwhile transforms the single-ended signal sent from the mid-stage HF amplifier into two differential signals to improve the suppression performance of common mode noise in the chip; wherein the said two differential signals are the first differential signal with the phase of 0 degree and the second differential signal with the phase of 180 degree, respectively;

A quadrature voltage-controlled oscillator, to output four local oscillation (LO) signals with a phase difference of 90 degree between each other, the four LO signals are a first LO signal with a phase of 90 degree, a second LO signal with a phase of 0 degree, a third LO signal with a phase of 270 degree and a fourth LO signal with a phase of 180 degree;

A quadrature frequency mixer, to receive the four LO signals sent from the said Quadrature voltage-controlled oscillator and the two differential signals sent from the pre-amplifier, wherein the quadrature mixer mixes the first LO signal with the first differential signal to produce a first IF signal with a phase of 90 degree, mixes the second LO signal with the first differential signal to produce a second IF signal with a phase of 0 degree, mixes the third LO signal with the second differential signal to produce a third IF signal with the phase of 270 degree, and mixes the fourth LO signal with the second differential signal to produce a fourth IF signal with the phase of 180 degree;

An In-phase/Quadrature (IQ) intermediate frequency amplifier, to receive the four intermediate frequency (IF) signals sent by the said quadrature mixer, to improve the driving capability of the quadrature mixer and to prevent the signals from attenuation;

A Polyphase filter, to receive the output of the said on-chip IQ intermediate frequency amplifier, and to filter the four IF signals, which eliminates minor image signal and realizes the mirror image suppression of the chip, and then to add the first IF signal with the second IF signal, to add the third IF signal with the fourth IF signal, which are of the four IF signals, with generating two signal outputs.

The LNB frequency down conversion chip circuit further includes a control circuit for on-chip high frequency (HF) amplifier transistor and a vertical/horizontal switching circuit, to connect to the vertical-stage, horizontal-stage and mid-stage HF amplifier of the external circuit of the chip, wherein the control circuit on-chip for HF amplifier transistor provides bias circuits for the source electrode, drain electrode and gate electrode of the HF amplifier transistors of the said vertical-stage, horizontal-stage and mid-stage HF amplifier and controls the operating current of the HF amplifier transistors in the normal operating range; the vertical/horizontal switching circuit turns on or off the bias sent to the HF amplifier transistor according to the value of the vertical/horizontal switching voltages to realize the receiving switch between vertical and horizontal signals, meanwhile, the mid-stage HF amplifier is controlled in constant operating mode.

The LNB frequency down conversion chip circuit further includes an on-chip intermediate frequency (IF) amplifier, to receive the output of the said polyphase filter, drive the off-chip 75 ohm cable line, ensure output matching, especially the matching with Set-Top Box (STB), and output the intermediate frequency signal.

Figure 4:
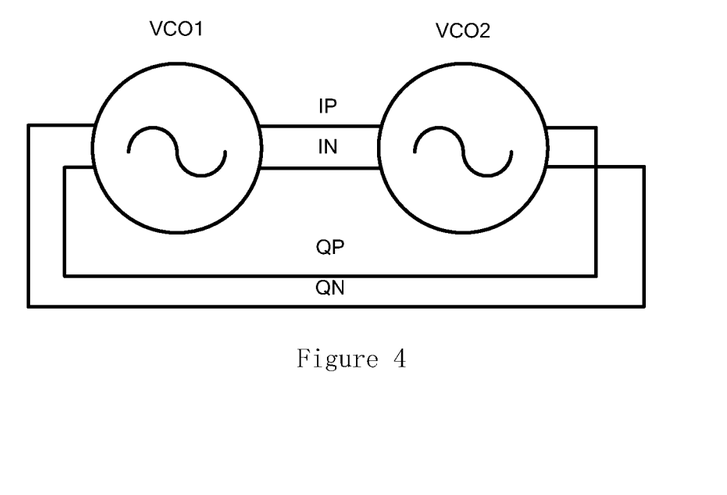
FIGS. 4 and 5 are the schematic figures of a voltage-controlled oscillator in the LNB frequency down conversion circuit of the present invention.
Figure 5:
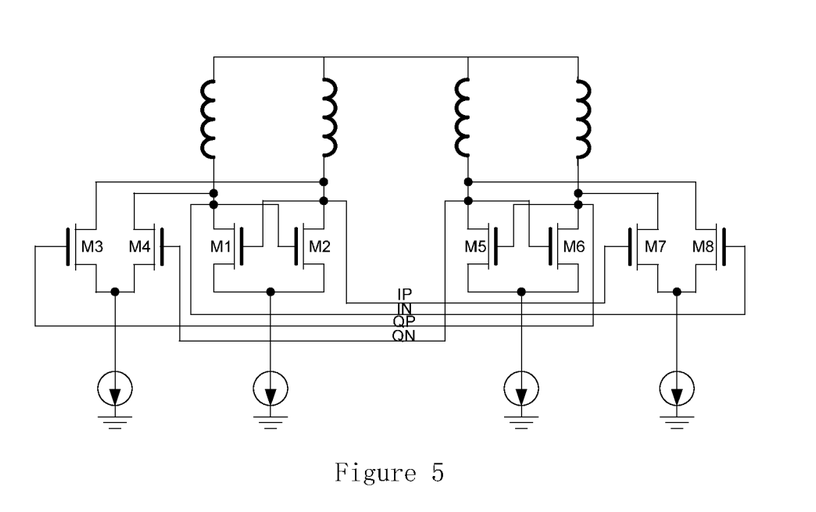

The said Quadrature voltage-controlled oscillator, as shown in FIGS. 4 and 5, includes two voltage-controlled oscillator units VCO1 and VCO2 coupled each other, which output four local oscillation (LO) signals with phase difference of 90° with each other, which are the first LO signal (IP) with a phase of 90 degree, the second LO signal (QP) with a phase of 0 degree, the third LO signal (IN) with a phase of 270 degree and the fourth LO signal (QN) with a phase of 180 degree.

The present invention adopts Hartley structure to realize the function of minor image suppression. According to the theory of frequency down converter of Hartley structure that the present invention must generate quadrature LO signal, which is realized in three ways: polyphase filter scheme, frequency-halving scheme and Quadrature voltage-controlled oscillator (VCO) scheme.

The present invention adopts the solution of Quadrature VCO scheme, which avoids the driving problem of polyphase filter in high frequency. Meanwhile, if frequency-halving scheme is adopted, VCO needs to be operated at double frequency of the local oscillation (LO). For the LO frequency of Ku wave band of 10.6 GHz, VCO needs to be operated at 21 GHz. At such a high frequency, CMOS frequency-halving device is difficult to implement.

As is shown in FIGS. 4 and 5, Quadrature VCO generates the 4 LO signals with phase difference of 90° between each other, by the coupling between two VCO units. The two VCO units are respectively consisted of main oscillator transistor (M1, M2, M5, M6) and coupling transistor (M3, M4, M7, M8). IP and IN, the output signals of the first stage of voltage-controlled oscillator VCO1, are inputted into the coupling transistor of the second stage of voltage-controlled oscillator VCO2, while QP and QN, the output signals of the second stage of voltage-controlled oscillator VCO2, are inputted into the coupling transistor of the first stage of voltage-controlled oscillator VCO1, so that a phase difference of 90° can be ensured between IP, QP, IN, QN.

The voltage-controlled oscillator connects to Phase-locked loop circuit and prescaler circuit. The frequency stability of the voltage-controlled oscillator is achieved by the Phase-locked loop circuit, i.e., the output signal of voltage-controlled oscillator is continually divided by the prescaler circuit to the frequency of the reference clock, then the Phase-locked loop circuit compares the frequency of the output signal with the frequency of the reference clock, and the frequency deviation is compensated through the continual adjustment of the variable capacitor of the voltage-controlled oscillator, to achieve an accurate LO frequency.

To ensure that the LO signal generated by the VCO will not vary with the environment variations such as temperature and so on, the LO signal of the VCO must be in phase-locked stage by the Phase-locked loop circuit (PLL), so as to ensure an accurate LO signal, and overcome the shortcoming of the frequency instability of the DRO in the discrete design. The details of the solution are, the LO signal of the VCO is divided by the prescaler circuit, the frequency is divided into a frequency close to the reference clock frequency (i.e. the crystal clock frequency), and the Phase-locked loop circuit compares it with the reference clock frequency, the comparison error is compensated by continual adjustments on the variable capacitor of the VCO to realize the phase-locked function to the LO signal. Because of the high quality factor (Q) and the high frequency stability of the crystal, the Phase-locked loop circuit phase-locks the frequency of the VCO and the crystal frequency to ensure the frequency stability of the VCO.

To improve the frequency stability and the phase noise performance of the LNB system, the internal of system can integrates a Phase-locked loop circuit and crystal oscillator, to realize the accurate frequency controlling of the VCO and filter the low frequency phase noise of the VCO.

Figure 6:
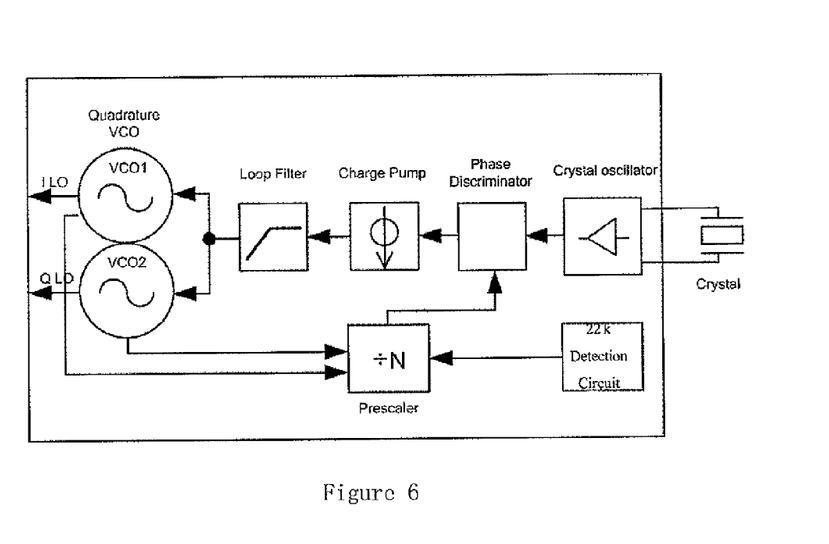
FIG. 6 is the schematic figure of a Phase-locked loop circuit in the LNB frequency down conversion circuit of the present invention.

As is shown in FIG. 6, a prescaler continually divides high frequency signals close to 10 GHz sent by a Quadrature voltage-controlled oscillator composed of two VCO units, to the frequency close to the crystal oscillating frequency, which is sent to a phase discriminator. Meanwhile, the crystal oscillator also sends a stable crystal frequency signal to the phase discriminator. The phase discriminator compares the phase error between the two groups of frequency signals, and sends a corresponding controlling signal to a charge pump. The loop filter filters the output signal of the charge pump to a controlling voltage signal which varies with the phase to control the variable capacitor within the VCO, which realizes the function of the accurate VCO frequency adjustment.

The present invention adopts a quadrature cross coupling VCO composed by two VCO units. The phases of the two VCO units are different, but their frequency is absolutely the same. Therefore the loop filter only needs to filter the controlling voltage, and then sends it to both of the two VCO units at the same time.

The whole Phase-locked loop circuit has a negative feedback characteristics, which realizes that the phase, i.e. the frequency of the VCO is in direct proportion to the phase and frequency of the crystal oscillator. Because of the high quality factor (Q) of the crystal, it has very high frequency stability, thus the frequency stability of the VCO is ensured.

While sending a 10 GHz high frequency signal to the Phase-locked loop circuit, the VCO also sends a 10 GHz signal to the mixer to realize the frequency down conversion function.

Figure 7:
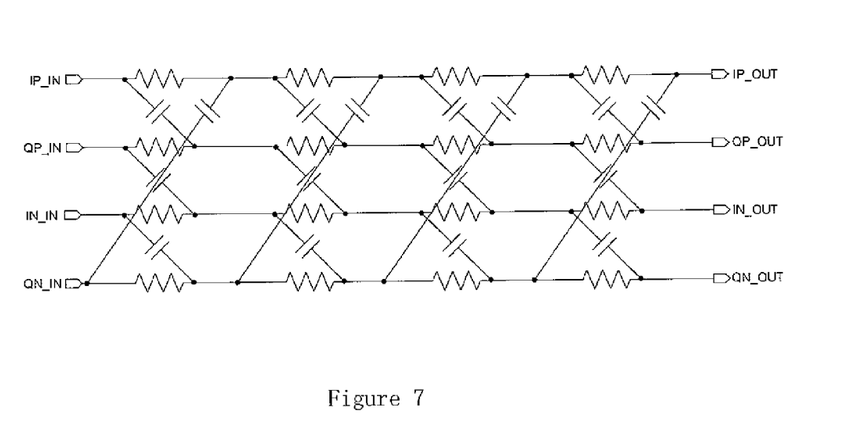
FIG. 7 is the schematic figure of a polyphase filter in the LNB frequency down conversion circuit of the present invention.

The passive polyphase filter contains four paths corresponding to the four intermediate frequency signals, as shown in FIG. 7. Each path has several resistors in series, wherein the fore end of each resistor in a previous path connect to the rear end of the corresponding resistor in a following path through a capacitor, the fore end of each resistor in the last path connect to the rear end of the corresponding resistor in the first path.

The present invention adopts a Hartley structure to realize the function of mirror image suppression. According to the theory of frequency down converter in a Hartley structure, after the radio-frequency signal is down converted by a quadrature mixer, it requires polyphase filter to filter and remove the signal of mirror image position. As LNB system requires the intermediate frequency signal output from 950 MHz to 2150 MHz in L band, the present invention adopts a structure of 4-stage passive polyphase filter. As is shown in FIG. 7, Polyphase filter has a feature of band-stop to negative frequency (or positive frequency) signal while remains a feature of band-pass to positive frequency (or negative frequency) signal. Meanwhile, the width of band is determined by the number of stages; the more the stages are, the wider the bandwidth and the larger the in-band insertion loss will be. The present invention, by means of compromising the width of band-stop and in-band insertion loss, chooses the structure of 4-stage polyphase filter.

The LNB frequency down conversion integrated circuit further includes an on-chip 22 kHz detection circuit, to respond to the received 22 kHz frequency signal. When the 22 kHz frequency signal exists, the detection circuit will send high level to the Phase-locked loop circuit, which controls the voltage-controlled oscillator to operate at a high local oscillation (LO). And once the 22 kHz frequency signal disappears, the said detection circuit will send low level to the Phase-locked loop circuit, which controls the voltage-controlled oscillator to operate at low LO.

The LNB frequency down conversion integrated circuit further includes an on-chip negative voltage generating circuit, to generate negative voltages and to provide necessary bias point for the grid voltage of the high frequency (HF) amplifier transistors in the horizontal-stage, vertical-stage and mid-stage HF amplifiers.

The LNB frequency down conversion integrated circuit further includes an on-chip voltage regulator circuit, to provide the power supply to other parts of the LNB frequency down conversion circuit.

The LNB frequency down conversion integrated circuit further includes an on-chip crystal oscillator circuit, to provide reference frequency for other parts of the LNB frequency down conversion circuit.

The present invention also disclosed a type of LNB frequency down conversion circuit, including the LNB frequency down conversion integrated circuit mentioned above, and the external circuit of the LNB frequency down conversion chip, wherein the external circuit includes:

a vertical-stage high frequency (HF) amplifier, to receive the vertical signal of the radio frequency and amplify the electromagnetic wave in the vertical direction of satellite transmission signal which is received by satellite receiving antenna, wherein the vertical-stage HF amplifier is featured with band-pass in the received frequency band;

a horizontal-stage high frequency (HF) amplifier, to receive the horizontal signal of the radio frequency and amplify the electromagnetic wave in the horizontal direction of satellite transmission signal which is received by satellite receiving antenna, and wherein the horizontal-stage HF amplifier is featured with band-pass in the received frequency band;

a mid-stage high frequency (HF) amplifier, to receive the output signals from the vertical-stage HF amplifier and the horizontal-stage HF amplifier, wherein the mid-stage HF amplifier is in constant operating mode, to further amplify the signals sent from the first stage HF amplifier, increases the whole gain of the amplifier in front of the frequency mixer and decreases the noise factor of the whole LNB system.

The external circuit further includes off-chip high frequency (HF) amplifier transistor control circuit and vertical/horizontal switching circuit, to connect to the vertical-stage, horizontal-stage and mid-stage HF amplifier of the external circuit, wherein the HF amplifier transistor control circuit provides bias circuit for the source electrode, drain electrode and gate electrode of the HF amplifier transistor of the vertical-stage, horizontal-stage and mid-stage HF amplifier and controls the operating current of the HF amplifier transistors in a normal operating range; wherein the vertical/horizontal switching circuit turns on or off the bias sent to the HF amplifier transistor according to the amount of the vertical/horizontal switching voltage to realize the receiving switch between vertical and horizontal signals, meanwhile, the mid-stage HF amplifier is controlled in a constant operating mode.

The external circuit further includes an off-chip intermediate frequency (IF) amplifier, to receive the output of the polyphase filters, to drive the off-chip 75 ohm cable line, to ensure the output matching and to output intermediate frequency signal.

The high frequency (HF) amplifier transistor control circuit and the vertical/horizontal switching circuit and the intermediate frequency amplifier can be integrated in the LNB frequency down conversion chip circuit, and also can be integrated in the external circuit as described before.

The external circuit further includes an off-chip 22 kHz frequency detection circuit, to respond to the received 22 kHz frequency signal, wherein when the 22 kHz frequency signal exists, the external 22 kHz frequency detection circuit may send the high level to the Phase-locked loop circuit which controls the voltage-controlled oscillator to operate at high local oscillation (LO); and once the 22 kHz frequency signal disappears, the off-chip 22 kHz frequency detection circuit will send low level to the Phase-locked loop circuit, which controls the voltage-controlled oscillator to operate at low LO.

The 22 kHz frequency detection circuit might be integrated in the LNB frequency down conversion chip i.e. the on-chip 22 kHz frequency detection circuit, or integrated in the external circuit as is described before. Or, the LNB frequency down conversion integrated circuit and the external circuit both integrate a 22 kHz frequency detection circuit, and the LNB frequency down conversion circuit can choose one of them to realize the corresponding function.

Wherever the 22 kHz frequency detection circuit is integrated, on chip or in the external circuit, depending on whether it have detected the 22 kHz frequency signal, the 22 kHz frequency detection circuit sends the corresponding controlling signal to the prescaler to change the dividing proportion of the prescaler as is shown in FIG. 6. For example, when the 22 kHz frequency signal has been detected, a high voltage level is sent to the prescaler; when the 22 kHz frequency signal has not been detected, a low voltage level is sent to the prescaler. The prescaler switches the different dividing proportion according to the received voltage sent from the 22 kHz frequency detection circuit to realize the function of changing the local oscillation (LO) frequency by switching the oscillating frequency of the VCO.

Generally, the LNB of Ku wave band works at the LO frequency of 9.75 GHz and 10.6 GHz. If the 22 kHz frequency signal do not exist, the 9.75 GHz LO is applied. When the 22 kHz frequency signal exists, a LO at 10.6 GHz is chosen.

The external circuit further includes an off-chip negative voltage generating circuit, to generate negative voltages and to provide necessary bias point for the grid voltage of the high frequency (HF) amplifier transistors of the said horizontal-stage, vertical-stage and mid-stage HF amplifiers.

The negative voltage generating circuit can be integrated in the LNB frequency down conversion chip circuit i.e. the on-chip negative voltage generating circuit, or integrated in the external circuit as described before. Or, the LNB frequency down conversion chip circuit and the external circuit both integrate a negative voltage generating circuit. The LNB frequency down conversion circuit can choose one of them to realize the corresponding function.

The external circuit further includes an off-chip voltage regulator circuit, to provide the power supply for the LNB frequency down conversion chip.

Both the LNB frequency down conversion chip and the external circuit can integrate a voltage regulator circuit, to ensure the stable power supply for the LNB frequency down conversion integrated circuit sufficiently.

The external circuit further includes an off-chip crystal oscillator circuit, to provide the reference frequency for the LNB frequency down conversion chip circuit.

The crystal oscillator circuit can be integrated in the LNB frequency down conversion chip i.e. the on-chip crystal oscillator circuit, or integrated in the external circuit as described before. Possibly, the LNB frequency down conversion chip and the external circuit both integrate a crystal oscillator circuit. The LNB frequency down conversion circuit can choose one of them to supply the reference frequency for the LNB frequency down conversion circuit.

The present invention also disclosed a type of LNB frequency down conversion chip, which integrates the LNB frequency down conversion integrated circuit. The LNB frequency down conversion chip connects the external circuit of the LNB frequency down conversion chip by the pins of the LNB frequency down conversion chip.

FIG. 3 shows an illustrative embodiment of the present invention. The present invention adopts Hartley receiver structure; the main objective is to realize the mirror image suppression function of chip. As the noise of the minor image frequency may worsen the noise factor of receiver by 3 dB, for the system like LNB, which has very strict requirement for noise figure, the performance of minor image suppression is important.

The present invention also disclosed a type of LNB frequency down conversion method realized by the use of the LNB frequency down conversion circuit mentioned before. The received signal is pre-amplified by a pre-amplifier, to improve the noise factor of the chip, and to prevent the noise of the whole LNB system from being worsened, meanwhile the received single-ended signal is transformed into two differential signals, to improve the suppression of common mode noise of the chip. The said two differential signals are the first differential signal with the phase of 0 degree and the second differential signal with the phase of 180 degree, respectively. The Quadrature voltage-controlled oscillator outputs four local oscillation (LO) signals with phases difference of 90° between with each other, which are the first LO signal with the phase of 90 degree, the second LO signal with the phase of 0 degree, the third LO signal with the phase of 270 degree and the fourth LO signal with the phase of 180 degree, and the quadrature mixer mixes the first LO signal with the first differential signal to produce the first intermediate frequency (IF) signal with the phase of 90 degree, mixes the second LO signal with the first differential signal to produce the second IF signal with the phase of 0 degree, mixes the third LO signal with the second differential signal to produce the third IF signal with the phase of 270 degree and mixes the fourth LO signal with the second differential signal to produce the fourth IF signal with the phase of 180 degree, and then the In-phase/Quadrature (IQ) intermediate frequency amplifier receives the four IF signals sent from the quadrature mixer, improves the driving capability of the quadrature mixer, and prevents the signals from attenuation; and then the Polyphase filter receives the output of the on-chip IQ intermediate frequency amplifier, filters the four IF signals, eliminates the minor image signal and realizes the minor image suppression function of the chip; and then adds the first IF signal with the second IF signal, adds the third IF signal with the fourth IF signal, which are of the four IF signals, with generating two signal outputs, and at last IF amplifier receives the outputs of the said Polyphase filter, drives the off-chip 75 ohm cable line, and ensures the output matching and outputs the IF signal.

The frequency stability of the voltage-controlled oscillator is achieved by the Phase-locked loop circuit, i.e. the output signal of the voltage-controlled oscillator is continually divided by the prescaler circuit to the signal with the frequency of the reference clock, then the Phase-locked loop circuit compares the frequency of the output signal with the frequency of the reference clock, and the frequency difference is compensated through the continual adjustment of the variable capacitor of the voltage-controlled oscillator, to achieve the exact LO frequency.

The high frequency (HF) amplifier transistor control circuit provides bias circuit for the source electrode, drain electrode and gate electrode of the HF amplifier transistor of the vertical-stage, horizontal-stage and mid-stage HF amplifier and controls the operating current of the HF amplifier transistor in a normal operating range; wherein the vertical/horizontal switching circuit turns on or off the bias sent to the HF amplifier transistor according to the amount of the vertical/horizontal switching voltages to make the receiving switch between vertical and horizontal signals, meanwhile, the mid-stage HF amplifier is controlled in constant operating mode.

The intermediate frequency (IF) amplifier receives the outputs of the polyphase filter, drives the off-chip 75 ohm cable line, ensures the output matching and outputs the IF signal.

The frequency stability of the voltage-controlled oscillator is achieved by the Phase-locked loop circuit, i.e. the output signal of the voltage-controlled oscillator is continually divided by the prescaler circuit to the signal with the frequency of the reference clock, then the Phase-locked loop circuit compares the frequency of the output signal with the frequency of reference clock, and the frequency difference is compensated through the continual adjustment of the variable capacitor of the voltage-controlled oscillator, to achieve the exact LO frequency.

The 22 kHz frequency detection circuit responds to the received 22 kHz frequency signal. When the 22 kHz frequency signal exists, the detection circuit may send the high level to the Phase-locked loop circuit, which controls the voltage-controlled oscillator to operate at high local oscillation (LO); and once the 22 kHz frequency signal disappears, the detection circuit may send low level to the Phase-locked loop circuit, which controls the voltage-controlled oscillator to operate in low LO.

The negative voltage generating circuit generates negative voltages and provides the necessary bias point for the grid voltage of the high frequency (HF) amplifier transistors of the horizontal-stage, vertical-stage and mid-stage HF amplifiers.

The basic principle of the Hartley structure adopted in the present invention carries out frequency down conversion to radio frequency signal with Quadrature LO and Quadrature mixer and realizes the phase shifting of 90° of mixed Quadrature intermediate frequency signal with passive polyphase filter to ensure the elimination of minor image signal and realization the function of minor image suppression.

The present invention can realize the mirror image suppression ratio of nearly 25 dB, basically stop mirror image frequency from worsening the noise. Meanwhile, the traditional LNB products adopting discrete components design need to install band-pass filter on PCB to meet the noise factor below 1 dB. With the present invention, which adopts frequency down conversion of Hartley structure, the minor image signal can be eliminated by frequency down conversion of quadrature mixer and phase shift of polyphase filter. In this way the band-pass filter can be omitted and PCB area can be saved and the application can be simplified.

One of the factors to realize Hartley structure is how to produce quadrature LO signal, especially for LNB chip of Ku band. As the required frequency range of LO signal is 9.75 GHz and 10.75 GHz or even needs the high frequency of 11.3 GHz, how to produce quadrature local oscillation (LO) signal is a keystone of the present invention.

Quadrature LO signal can be produced generally in three ways: polyphase filter scheme, frequency-halving scheme and quadrature VCO scheme. The present invention adopts the program of quadrature VCO, which can avoid the driving problem of polyphase filter in high frequency. Meanwhile, if frequency-halving scheme is adopted, VCO needs to be oscillated at double the local oscillation (LO). Frequency-halving device is difficult to implement.

Besides realizing the Hartley receiver with the mirror image performance, the present invention also utilize the feature of easily integrating of CMOS chip to integrate the 22 kHz frequency signal detection circuit, negative voltage generating circuit and receiver into one chip, which greatly reduces the cost of LNB production.

The present invention simplifies the application, production and repairing of LNB and saves the cost, as it integrates most of the discrete elements in the existing discrete LNB design. The frequency stability of LNB is improved significantly by integrating the phase-locked loop circuit. The bandpass filter on the PCB is saved by integrating mirror image suppression function so that the cost of the PCB is saved and the noise performance is improved. The LNB production cost is greatly reduced by integrating the detection of negative voltage, 22 KHz signal and the controlling of high frequency amplifier transistor. It overcomes the shortcoming of low yield rate of the existing technology in production, improves the finished product rate in production process, and improves the efficiency of production.

What is claimed is:

1. A low noise block (LNB) frequency down conversion integrated circuit comprising:
   a pre-amplifier, to receive output of a mid-stage high frequency (HF) amplifier of a front-end circuit and improve the noise factor of a chip, so that the noise of the whole LNB system will not worsen; to transform a single-ended signal sent from the mid-stage HF amplifier into two differential signals to improve the suppression function of common mode noise in the chip; wherein the said two differential signals are a first differential signal with the phase of 0 degree and a second differential signal with the phase of 180 degree, respectively;
   a quadrature voltage-controlled oscillator, to output four local oscillation (LO) signals with phase difference of 90 degrees between with each other, wherein the four LO signals are a first LO signal with the phase of 90 degree, a second LO signal with the phase of 0 degree, a third LO signal with the phase of 270 degree and a fourth LO signal with the phase of 180 degree, respectively;
   a quadrature frequency mixer, to receive the four LO signals sent from the said Quadrature voltage-controlled oscillator and the two differential signals sent from the said pre-amplifier, wherein the quadrature mixer mixes the first LO signal with the first differential signal to produce a first intermediate frequency (IF) signal with the phase of 90 degree, mixes the second LO signal with the first differential signal to produce a second IF signal with the phase of 0 degree, mixes the third LO signal with the second differential signal to produce a third IF signal with the phase of 270 degree, and mixes the fourth LO signal with the second differential signal to produce a fourth IF signal with the phase of 180 degree;
   an In-phase/Quadrature (IQ) intermediate frequency (IF) amplifier, to receive the four IF signals sent by the said quadrature frequency mixer, to improve the driving capability of the said quadrature frequency mixer and to prevent the signals from attenuation; and
   a polyphase filter, to receive the output of the on-chip IQ intermediate frequency amplifier, and to filter the four IF signals, which eliminates minor image signal and realizes the minor image suppression function of the chip; and then to add the first IF signal with the second IF signal, to add the third IF signal with the fourth IF signal, which are of the four IF signals, thus generating two signal outputs.

2. The LNB frequency down conversion integrated circuit of claim 1, further comprising: an on-chip high frequency (HF) amplifier transistor control circuit and a vertical/horizontal switching circuit, to connect to the vertical-stage, horizontal-stage and mid-stage HF amplifier of the external circuit, wherein the on-chip HF amplifier transistor control circuit provides bias circuit for the source electrode, drain electrode and gate electrode of the HF amplifier transistors of the said vertical-stage, horizontal-stage and mid-stage HF amplifier and controls the operating current of the HF amplifier transistors within the nominal operating range; wherein the vertical/horizontal switching circuit turns on or off the bias sent to the HF amplifier transistor according to the value of the vertical/horizontal switching voltage to realize the receiving switch between vertical and horizontal signals, meanwhile, the said mid-stage HF amplifier is controlled in constant operating mode.

3. The LNB frequency down conversion integrated circuit of claim 1, further comprising: an on-chip intermediate frequency (IF) amplifier, to receive the output of the polyphase filter, drive the off-chip 75 ohm cable line, ensure output matching and output intermediate frequency signal.

4. The LNB frequency down conversion integrated circuit of claim 1, wherein the quadrature voltage-controlled oscillator includes two voltage-controlled oscillator units coupled with each other, which output four local oscillator (LO) signals with phase difference of 90° one another.

5. The LNB frequency down conversion integrated circuit of claim 4, wherein the voltage-controlled oscillator connects to a phase-locked loop circuit and a prescaler circuit, wherein the frequency stability of the said voltage-controlled oscillator is achieved by the phase-locked loop circuit, which is that the output signal of the voltage-controlled oscillator is continually divided by the prescaler circuit to the signal with the frequency of the reference clock, then the phase-locked loop circuit compares the frequencies of the output signal with the frequency of the reference clock, and the frequency difference is compensated for through the continual adjustment of the variable capacitor of the voltage-controlled oscillator, then achieves the exact LO frequency.

6. The LNB frequency down conversion integrated circuit of claim 1, wherein the polyphase filter contains four paths responding to the four intermediate frequency signals, each of which has several resistors connected in series, wherein the front end of each resistor of a previous path connect to the back end of the corresponding resistor of a following path through a capacitor, the front end of each resistor of the last path connect to the back end of the corresponding resistor of the first path.

7. The LNB frequency down conversion integrated circuit of claim 1, further comprising: an on-chip 22 kHz frequency detection circuit, to respond to the received 22 kHz frequency signal, wherein when the 22 kHz frequency signal exists, the said detection circuit may send a high voltage level to the Phase-locked loop circuit which controls the voltage-controlled oscillator to operate at high local oscillation (LO); and once the 22 kHz frequency signal is removed, the said detection circuit may send a low level to the said Phase-locked loop circuit, which controls the voltage-controlled oscillator to operate at low LO.

8. The LNB frequency down conversion chip circuit of claim 1, further comprising: an on-chip negative voltage generating circuit, to generate negative voltages and to provide the necessary bias point for the grid voltage of the high frequency (HF) amplifier transistor of the horizontal-stage, vertical-stage and mid-stage HF amplifiers.

9. The LNB frequency down conversion chip circuit of claim 1, further comprising: an on-chip voltage regulator circuit, to provide the power supply for the other parts of the said LNB frequency down conversion chip circuit.

10. The LNB frequency down conversion chip circuit of claim 1, further comprising: an on-chip crystal oscillator circuit, to provide the reference frequency signal for the other parts of the said LNB frequency down conversion chip circuit.

11. A low noise block (LNB) frequency down conversion circuit comprising: an LNB frequency down conversion integrated circuit according to claim 1, and the external circuit of the LNB frequency down conversion chip, wherein the external circuit includes:
  a vertical-stage high frequency (HF) amplifier, to receive the vertical signal of the radio frequency and amplify the electromagnetic wave in the vertical direction of satellite transmission signal which is received by satellite receiving antenna, wherein the said vertical-stage HF amplifier is featured with band pass in the received frequency band;
  a horizontal-stage high frequency (HF) amplifier, to receive the horizontal signal of the radio frequency and amplify the electromagnetic wave in the horizontal direction of satellite transmission signal which is received by satellite receiving antenna, and wherein the said horizontal-stage HF amplifier is featured with band pass in the received frequency band; and
  a mid-stage high frequency (HF) amplifier, to receive the output signals from the said vertical-stage HF amplifier and horizontal-stage HF amplifier, wherein the said mid-stage HF amplifier is in constant operating mode to twice amplify the signals sent from the $1^{st}$ stage high frequency (HF) amplifier, increase the whole gain of the amplifier in front of the frequency mixer and decrease the noise factor of the whole LNB system.

12. The LNB frequency down conversion circuit of claim 11, wherein the external circuit further comprises off-chip high frequency (HF) amplifier transistor control circuit and vertical/horizontal switching circuit, to connect to the vertical-stage, horizontal-stage and mid-stage high frequency (HF) amplifier of the external circuit, wherein the said HF amplifier control circuit provides bias circuit for the source electrode, drain electrode and gate electrode of the HF amplifier transistors of the said vertical-stage, horizontal-stage and mid-stage HF amplifier and controls the operating current of the HF amplifier transistors in the nominal operating range; wherein the vertical/horizontal switching circuit turns on or off the bias sent to the HF amplifier transistor according to the value of the vertical/horizontal switching voltages to realize the receiving switch between vertical and horizontal signals, meanwhile, the said mid-stage HF amplifier is controlled in a constant operating mode.

13. The LNB frequency down conversion circuit of claim 11, wherein the external circuit further comprises an off-chip intermediate frequency (IF) amplifier, to receive the output of the said polyphase filter, to drive the off-chip 75 ohm cable line, to ensure output matching and to output intermediate frequency signal.

14. The LNB frequency down conversion circuit of claim 11, wherein the external circuit further comprises an off-chip external 22 kHz frequency detection circuit, in respond to the received 22 kHz frequency signal, wherein when the 22 kHz frequency signal exists, the said off-chip 22 kHz frequency detection circuit sends a high level to the Phase-locked loop circuit which controls the voltage-controlled oscillator to operate at high local oscillation (LO); and once the 22 kHz frequency signal disappears, the said detection circuit sends a low level to the said Phase-locked loop circuit, which controls the voltage-controlled oscillator to operate at low LO.

15. The LNB frequency down conversion circuit of claim 11, wherein the external circuit further comprises an off-chip negative voltage generating circuit, to generate negative voltages and to provide the necessary bias point for the grid voltage of the high frequency (HF) amplifier transistors of the horizontal-stage, vertical-stage and mid-stage HF amplifiers.

16. The LNB frequency down conversion circuit of claim 11, wherein the external circuit further comprises an off-chip voltage regulator circuit, to provide the power supply for the said LNB frequency down conversion integrated circuit.

17. The LNB frequency down conversion circuit of claim 11, wherein the external circuit further comprises an off-chip crystal oscillator circuit, to provide the reference frequency for the said LNB frequency down conversion integrated circuit.

18. An LNB frequency down conversion chip, comprising an LNB frequency down conversion integrated circuit according to claim 1, and wherein the LNB frequency down conversion chip connects to the external circuit of the LNB frequency down conversion chip through the pins of the LNB frequency down conversion chip.

19. A low noise block (LNB) frequency down conversion method comprising: using an LNB frequency down conversion integrated circuit according to claim 1, wherein the received signal is pre-amplified by the said pre-amplifier, to improve the noise factor of the chip, and to prevent the noise of the whole LNB system from being worsened, meanwhile the received single-ended signal is transformed into two differential signals, to improve the suppression of common mode noise; wherein the said two differential signal are the first differential signal with the phase of 0 degree and the second differential signal with the phase of 180 degree; wherein the Quadrature voltage-controlled oscillator outputs four local oscillation (LO) signals with phase difference of 90° to each other, which are the first LO signal with the phase of 90 degree, the second LO signal with the phase of 0 degree, the third LO signal with the phase of 270 degree and the fourth LO signal with the phase of 180 degree, and wherein the quadrature frequency mixer mixes the first LO signal with the first differential signal to produce the first intermediate frequency (IF) signal with the phase of 90 degree, mixes the second LO signal with the first differential signal to produce the second IF signal with the phase of 0 degree, mixes the third LO signal with the second differential signal to produce the third IF signal with the phase of 270 degree and mixes the fourth LO signal with the second differential signal to produce the fourth IF signal with the phase of 180 degree; and then the said In-phase/Quadrature (IQ) intermediate frequency amplifier receives the four IF signals sent from the said quadrature frequency mixer, improves the driving capability of the said quadrature mixer, and prevents the signals from attenuation; and then the said Polyphase filter receives the output of IQ intermediate frequency amplifier, filters the signals from the four IF signals, which eliminates mirror image signal and realizes the mirror image suppression function of the chip; and then to add the first IF signal with the second IF signal, to add the third IF signal with the fourth IF signal, which are of the four IF signals, thus generating two signal outputs, and at last intermediate frequency (IF) amplifier receives the outputs of the said Polyphase filter, drives the off-chip 75 ohm cable line, ensures the output matching and outputs the IF signal.

20. The LNB frequency down conversion method of claim 19, wherein the frequency stability of the said voltage-controlled oscillator is achieved by the Phase-locked loop circuit, which is that the output signal of the voltage-controlled oscillator is continually divided by the pre-scaler circuit into the signal with the frequency of the reference clock, then the Phase-locked loop circuit compares the frequency of the output signal with the frequency of the reference clock, and the frequency difference is compensated through the continual adjustment of the variable capacitor of the voltage-controlled oscillator, thus achieves the exact LO frequency.

21. The LNB frequency down conversion method of claim 19, further comprising: a high frequency (HF) amplifier transistor control circuit and vertical/horizontal switching circuit, to connect to the vertical-stage, horizontal-stage and mid-stage HF amplifier of the external circuit, wherein the said high frequency (HF) amplifier transistor control circuit provides bias circuit for the source electrode, drain electrode and gate electrode of the HF amplifier transistor of the said vertical-stage, horizontal-stage and mid-stage HF amplifier and controls the operating current of the HF amplifier transistor in the nominal operating range; wherein the vertical/horizontal switching circuit turns on or off the bias sent to the HF amplifier transistors according to the amount of the vertical/horizontal switching voltage to realize the receiving switch between vertical and horizontal signals, meanwhile, the said mid-stage HF amplifier is controlled in a constant operating mode.

22. The LNB frequency down conversion method of claim 19, wherein the voltage-controlled oscillator connects to a Phase-locked loop circuit and a prescaler circuit, wherein the frequency stability of the said voltage-controlled oscillator is achieved by the Phase-locked loop circuit, which is that the output signal of the voltage-controlled oscillator is continually divided by the prescaler circuit to the signal with the frequency of the reference clock, then the Phase-locked loop circuit compares the frequency of the output signal with the frequency of the reference clock, and the frequency difference is compensated through the continual adjustment of the variable capacitor of the voltage-controlled oscillator, thus achieves the exact LO frequency.

23. The LNB frequency down conversion method of claim 19, further comprising: a 22 kHz frequency detection circuit, to respond to the received 22 kHz frequency signal, wherein when the 22 kHz frequency signal exists, the said 22 kHz detection circuit may send a high level to the Phase-locked loop circuit, which controls the voltage-controlled oscillator to operate at high local oscillation (LO); and once the 22 kHz frequency signal disappears, the said detection circuit may send a low level to the said Phase-locked loop circuit, which controls the voltage-controlled oscillator to operate at low LO.

24. The LNB frequency down conversion method of claim 19, further comprising: a negative voltage generating circuit, to generate negative voltages and to provide the necessary bias point for the grid voltage of the high frequency (HF) amplifier transistors of the horizontal-stage, vertical-stage and mid-stage HF amplifiers.

25. The LNB frequency down conversion method of claim 19, wherein a mid-stage HF amplifier receives output of the polyphase filter, drives the off-chip 75 ohm cable line, ensures the output matching and outputs the IF signal.

\* \* \* \* \*